(12) United States Patent
Williams et al.

(10) Patent No.: US 7,578,883 B1
(45) Date of Patent: Aug. 25, 2009

(54) ARRANGEMENT AND METHOD FOR ABATING EFFLUENT FROM A PROCESS

(75) Inventors: Michael Williams, Gresham, OR (US); Michael Barthman, Boring, OR (US)

(73) Assignee: LSI Corporation, Milpitas, CA (US)

( * ) Notice: Subject to any disclaimer, the term of this patent is extended or adjusted under 35 U.S.C. 154(b) by 1617 days.

(21) Appl. No.: 09/942,330

(22) Filed: Aug. 29, 2001

(51) Int. Cl.
| | |
|---|---|
| *C23C 16/00* | (2006.01) |
| *B03C 3/00* | (2006.01) |
| *B01D 53/02* | (2006.01) |
| *B01D 45/18* | (2006.01) |
| *B01D 47/00* | (2006.01) |
| *C23C 16/06* | (2006.01) |
| *C23C 16/22* | (2006.01) |

(52) U.S. Cl. .............................. 118/715; 96/64; 96/152; 96/139; 96/232; 96/239; 96/302; 96/304; 96/305; 96/320; 95/149; 156/345.33

(58) Field of Classification Search ............ 156/345.29; 68/76; 118/715; 96/64, 152, 139, 232, 239, 96/302, 304, 305, 320; 95/149
See application file for complete search history.

(56) References Cited

U.S. PATENT DOCUMENTS

| | | | | |
|---|---|---|---|---|
| 2,245,145 A | * | 6/1941 | Hall et al. .................... | 422/191 |
| 3,425,810 A | * | 2/1969 | Scott .......................... | 422/191 |
| 3,607,000 A | * | 9/1971 | Beal et al. .................... | 423/659 |
| 3,702,619 A | * | 11/1972 | Son ............................. | 137/3 |
| 3,703,798 A | * | 11/1972 | Pretorius et al. ............... | 95/82 |
| 3,722,185 A | * | 3/1973 | Miczek ........................ | 96/316 |
| 3,746,515 A | * | 7/1973 | Friedman ..................... | 422/191 |
| 4,311,671 A | * | 1/1982 | Notman ....................... | 422/148 |
| 4,411,877 A | * | 10/1983 | Notman ....................... | 423/359 |
| 4,482,523 A | * | 11/1984 | Peterson ...................... | 422/148 |
| 4,747,367 A | * | 5/1988 | Posa .......................... | 118/715 |
| 4,999,302 A | * | 3/1991 | Kahler et al. ................. | 435/266 |
| 5,011,520 A | * | 4/1991 | Carr et al. .................... | 96/234 |
| 5,137,701 A | * | 8/1992 | Mundt ........................ | 423/210 |
| 5,384,051 A | * | 1/1995 | McGinness ................... | 210/761 |
| 5,486,339 A | * | 1/1996 | Bizzotto ...................... | 422/193 |
| 5,573,663 A | * | 11/1996 | Junius et al. .................. | 210/189 |
| 5,593,548 A | * | 1/1997 | Yeoman et al. ............... | 203/29 |
| 5,756,048 A | * | 5/1998 | Zardi et al. ................... | 422/49 |

* cited by examiner

*Primary Examiner*—Rudy Zervigon
(74) *Attorney, Agent, or Firm*—Maginot, Moore & Beck

(57) ABSTRACT

An arrangement and associated method for abating effluent from an etching process is disclosed.

18 Claims, 3 Drawing Sheets

ARRANGEMENT AND METHOD FOR ABATING EFFLUENT FROM A PROCESS

TECHNICAL FIELD OF THE INVENTION

The present invention relates generally to an arrangement and method for abating effluent from a process, and more particularly to an arrangement and method for abating effluent from an etching process.

BACKGROUND OF THE INVENTION

The fabrication of semiconductor wafers can include the use of an etching process. An etching process is utilized to remove materials from the surface of a semiconductor wafer, or from films deposited on the wafer, through exposure to a highly reactive chemical species present in an etch reactor. Through the etch process, selected materials are removed from the wafer or film, which shapes the profile and critical dimensions of the remaining materials. The material remaining on the semiconductor wafer can thus become, for example, an operating transistor component, or is used to wire transistors together and thereby produce a functional semiconductor device.

The chemical reactions taking place during the etch process can release various gaseous by products into the etch reactor, e.g. aluminum chloride and/or boron oxide. In order to remove these gaseous by products, the etch reactor is typically in fluid communication with a device such as a wet scrubber. In particular, the effluent from the etch process which contains the gaseous by products is advanced from the etch reactor to the wet scrubber via a number pipes. The wet scrubber then removes the by products from the etch process effluent. However, a problem with the above described arrangement is that some gaseous by products contained in the effluent can precipitate out in the pipes prior to reaching the wet scrubber. This precipitation can obstruct the pipes and thus prevent effluent from reaching the wet scrubber. Therefore, the etching process must be stopped and the pipes cleaned out before additional etching can take place. Stopping the etching process and cleaning the pipes is time consuming and expensive and thus decreases the efficiency of semiconductor wafer fabrication.

An additional problem with the above described arrangement is that many scrubbers are fabricated from stainless steel components and the etch process effluent tends to corrode these components. Therefore, after a certain amount of time these scrubbers must be replaced. The replacement of these scrubbers is also time consuming and expensive and thus further decreases the efficiency of semiconductor wafer fabrication.

Thus, a continuing need exists for an arrangement and method for abating effluent from an etching process which address one or more of the above described problems.

SUMMARY OF THE INVENTION

In accordance with one embodiment of the present invention, there is provided a process effluent abatement arrangement. The arrangement includes an enclosure which defines an interior void. The arrangement also includes a first partition having a first orifice defined therein. The first partition is positioned within the interior void such that (i) the first partition divides the interior void into a first chamber and a second chamber and (ii) the first orifice is in fluid communication with the first chamber and the second chamber. The arrangement further includes a gas connector which has (i) a passageway defined therethrough and (ii) a gas port in fluid communication with the passageway. The passageway (A) has an inlet and an outlet and (B) is in direct fluid communication with the first chamber of the enclosure. The arrangement also includes a gas dispenser in direct fluid communication with the second chamber of the enclosure. The arrangement further includes an exit port in fluid communication with the enclosure.

In accordance with another embodiment of the present invention, there is provided an arrangement for abating effluent. The arrangement includes an enclosure which defines an interior void. The arrangement also includes a gas connector which has (i) a passageway defined therethrough and (ii) a gas port in fluid communication with the passageway. The passageway (A) has an inlet and an outlet and (B) is in fluid communication with the interior void of the enclosure. The arrangement further includes a gas dispenser in fluid communication with the interior void of the enclosure. The arrangement also includes an exit port in fluid communication with the interior void of the enclosure. The arrangement still further includes an etch apparatus which generates an etch gas product. The etch apparatus is in fluid communication with the gas connector such that the etch gas product generated by the etch apparatus is advanced into the interior void of the enclosure.

In accordance with still another embodiment of the present invention, there is provided a method of abating an etch gas product generated from an etch apparatus. The method includes placing the etch apparatus in fluid communication with an apparatus which has (i) an enclosure which defines an interior void, (ii) a first partition having a first orifice defined therein, the first partition being positioned within the interior void of the enclosure such that (A) the first partition divides the interior void into a first chamber and a second chamber and (B) the first orifice is in fluid communication with the first chamber and the second chamber, (iii) a gas connector which has (A) a passageway defined therethrough, the passageway having an inlet and an outlet and being in direct fluid communication with the first chamber of the interior void and (B) a gas port in fluid communication with the passageway, (iv) a gas dispenser in direct fluid communication with the second chamber of the interior void, (v) an exit port in fluid communication with the interior void of the enclosure, (vi) a gas source containing a gas, the gas source being in fluid communication with the gas port of the gas connector such that the gas contained by the gas source is advanced into the passageway of the gas connector, and (vii) a humidified gas source for providing a humidified gas, the humidified gas source being in fluid communication with the gas dispenser such that the humidified gas is advanced into the gas dispenser and directly into the second chamber of the interior void. The method also includes advancing the etch gas product into the passageway of the gas connector. The method further includes advancing the gas from the gas source into the passageway of the gas connector at the same time the etch gas product is being advanced into the passageway. The method still further includes advancing the humidified gas from the humidified gas source into the second chamber of the interior void.

It is an object of the present invention to provide a new and useful arrangement and method for abating effluent from an etching process.

It is an object of the present invention to provide an improved arrangement and method for abating effluent from an etching process.

It is a further object of the present invention to provide an arrangement and method for abating effluent from an etching process which is relatively inexpensive.

The above and other objects, features, and advantages of the present invention will become apparent from the following description and the attached drawings.

DETAILED DESCRIPTION OF A PREFERRED EMBODIMENT

Figure 1:
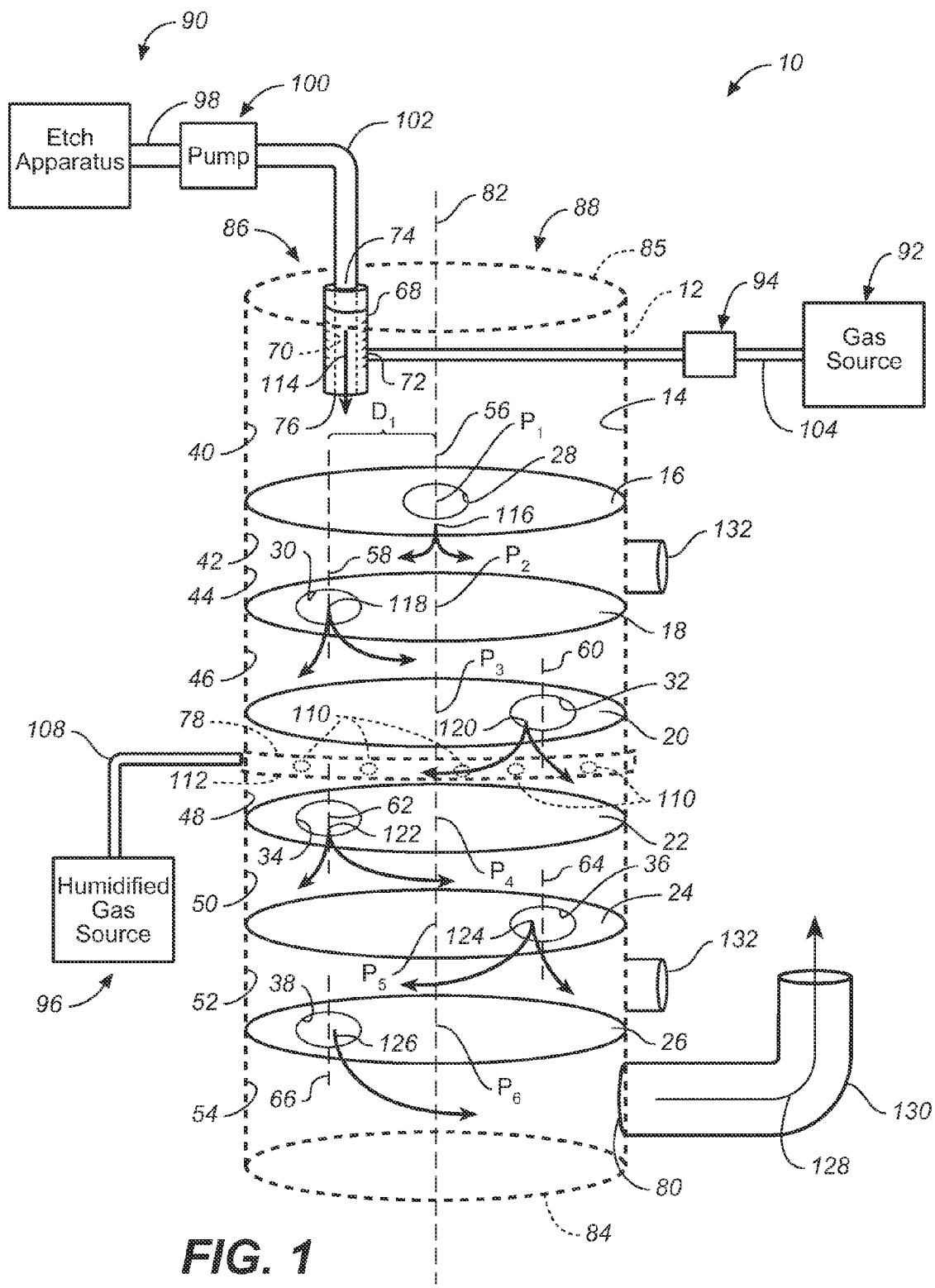
FIG. 1. is a partial schematic view of one embodiment of an arrangement for abating effluent from an etching process which incorporates various features of the present invention therein.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Now referring to FIG. 1, there is shown one exemplary embodiment of a process effluent abatement arrangement 10 which incorporates the features of the present invention therein. In particular, arrangement 10 can be utilized to abate effluent generated from an etching process. More particularly, arrangement 10 can be utilized to abate effluent generated from a metal etching process employed in the fabrication of semiconductor wafers.

Still referring to FIG. 1, arrangement 10 includes an enclosure 12 which defines an interior void 14. Enclosure 12 also has an end wall 84 and an end wall 85. As will be discussed in greater detail below, arrangement 10 also includes a number of partitions 16, 18, 20, 22, 24, and 26 positioned within interior void 14. Arrangement 10 further includes a gas connector 68 which has (i) a passageway 70 defined therethrough and (ii) a gas port 72 in fluid communication with passageway 70. Passageway 70 has an inlet 74 and an outlet 76. Gas connector 68 can be a commercially available KF-40 SS manifold. Passageway 70 is in fluid communication with interior void 14. Arrangement 10 also includes a gas dispenser 78 which is in fluid communication with interior void 14. Arrangement 10 further includes an exit port 80 in fluid communication with interior void 14. Arrangement 10 also includes a number of inspection ports 132 which allow the visual inspection of interior void 14. Inspection ports 132 can be 2" PVC caps attached to enclosure 12 such that the caps allow the visual inspection of interior void 14. In addition, arrangement 10 includes a pipe 130 which is in fluid communication with (i) exit port 80 and (ii) a facility exhaust system (not shown). Arrangement 10 further includes an etch apparatus 90, a gas source 92, a heating element 94, and a humidified gas source 96.

With respect to partitions 16, 18, 20, 22, 24, and 26, each partition is positioned within interior void 14 of enclosure 12. In particular, partition 16 is positioned within interior void 14 such that (i) partition 16 divides interior void 14 into a first chamber 40 and a second chamber 42 and (ii) a longitudinal axis 82 of enclosure 12 passes through a center point $P_1$ of partition 16. Each partition 18, 20, 22, 24, and 26 is positioned within second chamber 42. In particular, each partition 18, 20, 22, 24, and 26 is spaced apart along longitudinal axis 82 of enclosure 12 so that longitudinal axis 82 passes through a center point $P_2$ of partition 18, a center point $P_3$ of partition 20, a center point $P_4$ of partition 22, a center point $P_5$ of partition 24, and a center point $P_6$ of partition 26. Furthermore, it is preferable that partition 18, partition 20, partition 22, partition 24, and partition 26 all be positioned within second chamber 42 such that second chamber 42 is divided into a sub-chamber 44, a sub-chamber 46, a sub-chamber 48, a sub-chamber 50, a sub-chamber 52, and a sub-chamber 54. Specifically, partitions 18, 20, 22, 24, and 26 are positioned in second chamber 42 in the following manner. Partition 18 is positioned adjacent to partition 16 such that sub-chamber 44 is interposed partition 16 and partition 18. Partition 20 is positioned adjacent to partition 18 such that sub-chamber 46 is interposed partition 18 and partition 20. Partition 22 is positioned adjacent to partition 20 such that sub-chamber 48 is interposed partition 20 and partition 22. Partition 24 is positioned adjacent to partition 22 such that sub-chamber 50 is interposed partition 22 and partition 24. Partition 26 is positioned adjacent to partition 24 such that sub-chamber 52 is interposed partition 24 and partition 26. End wall 84 of enclosure 12 is positioned adjacent to partition 26 such that sub-chamber 54 is interposed end wall 84 and partition 26.

Still referring to FIG. 1, it should be understood that each partition 16, 18, 20, 22, 24, and 26 has an orifice defined therein. In particular, partition 16 has an orifice 28 defined therein, partition 18 has an orifice 30 defined therein, partition 20 has an orifice 32 defined therein, partition 22 has an orifice 34 defined therein, partition 24 has an orifice 36 defined therein, and partition 26 has an orifice 38 defined therein. With respect to the relative position of each orifice it should be appreciated that each orifice has a central axis. In particular, orifice 28 has a central axis 56, orifice 30 has a central axis 58, orifice 32 has a central axis 60, orifice 34 has a central axis 62, orifice 36 has a central axis 64, and orifice 38 has a central axis 66.

Furthermore, central axis 56 of orifice 28 is aligned with longitudinal axis 82, central axis 58 of orifice 30 is offset relative to central axis 56 of orifice 28, central axis 60 of orifice 32 is offset relative to central axis 58 of orifice 30, central axis 62 of orifice 34 is offset relative central axis 60 of orifice 32, central axis 64 of orifice 36 is offset relative central axis 62 of orifice 34, and central axis 66 of orifice 38 is offset relative central axis 64 of orifice 36. What is meant herein by one central axis being "offset" from another central axis is that the two central axises are not linearly aligned and thus spaced apart from each other. For example, as shown in FIG. 1, central axis 58 is spaced apart from central axis 56 by a distance $D_1$. In addition, it should be understood that longitudinal axis 82 divides enclosure 12 into a first half 86 and a second half 88 and orifice 30, orifice 34, and orifice 38 are located in first half 86 while orifice 32 and orifice 36 are located in second half 88.

It should be understood that preferably, orifice 28 is in direct fluid communication with first chamber 40 and sub-chamber 44 (and thus second chamber 42), orifice 30 is in direct fluid communication with sub-chamber 44 and sub-chamber 46, orifice 32 is in direct fluid communication with sub-chamber 46 and sub-chamber 48, orifice 34 is in direct fluid communication with sub-chamber 48 and sub-chamber 50, orifice 36 is in direct fluid communication with sub-chamber 50 and sub-chamber 52, and orifice 38 is in direct fluid communication with sub-chamber 52 and sub-chamber 54. What is meant herein by an orifice being "in direct fluid communication" is that a fluid, such as a gas, can flow from the first location through the orifice and immediately be located within the second location without having to be advanced through any intervening locations (e.g. sub-chambers). For example, orifice 28 is in direct fluid communication with first chamber 40 and sub-chamber 44, therefore as a fluid flows from first chamber 40 it immediately passes through orifice 28 and then immediately enters sub-chamber 44 (and thus second chamber 42) and does not pass through any intervening chambers. This is in contrast to, for example, the relationship between orifice 28 and sub-chamber 46 which are in fluid communication, but not in direct fluid communication since a fluid has to pass through sub-chamber 44 and orifice 30 before entering sub-chamber 46.

Figure 2:
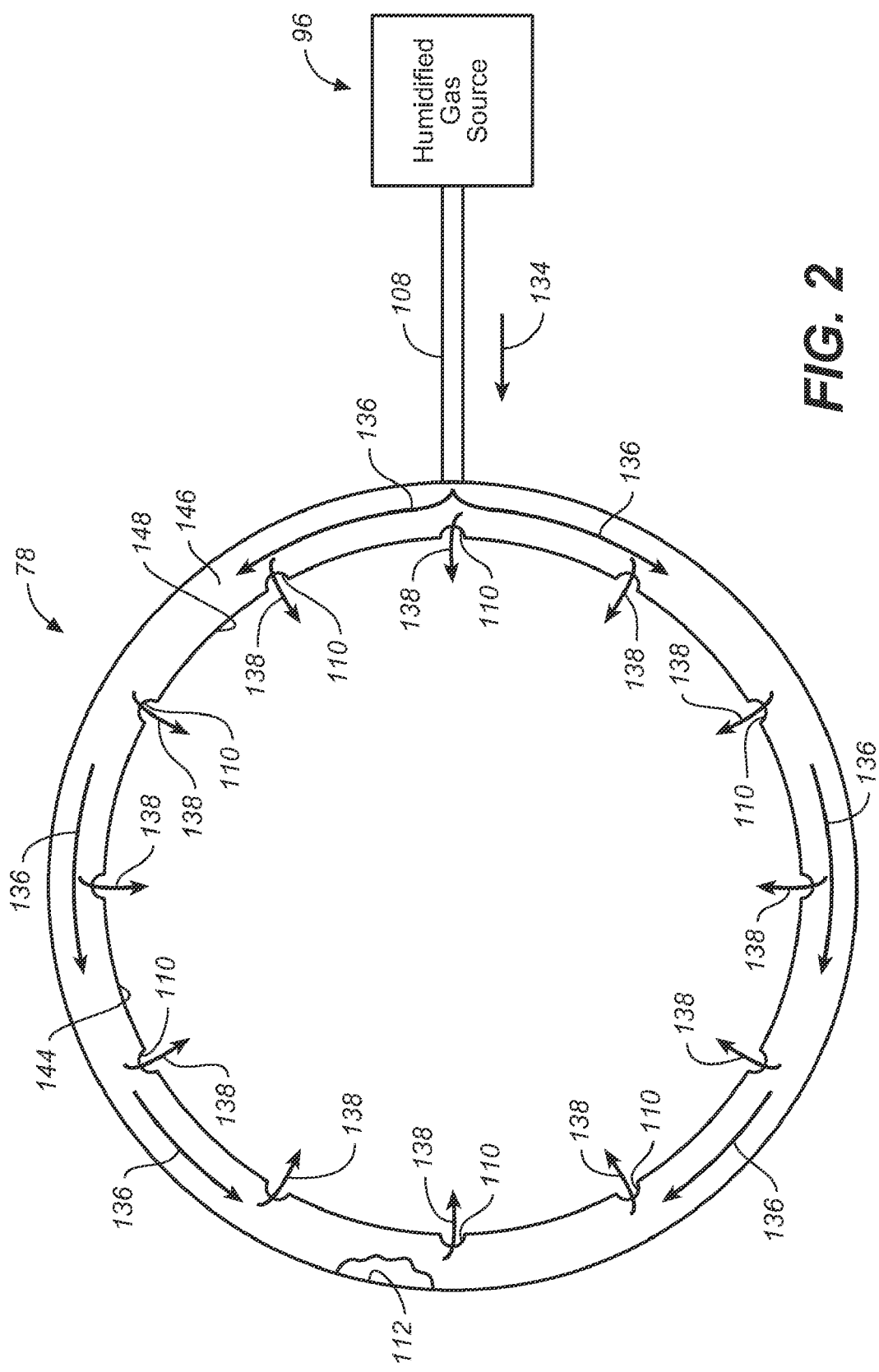
FIG. 2. is a top view of an exemplary gas dispenser of the arrangement shown in FIG. 1, note that the gas dispenser is shown removed from the enclosure of the arrangement of FIG. 1 and is shown schematically coupled to a humidified gas source of the arrangement of FIG. 1.
Figure 3:
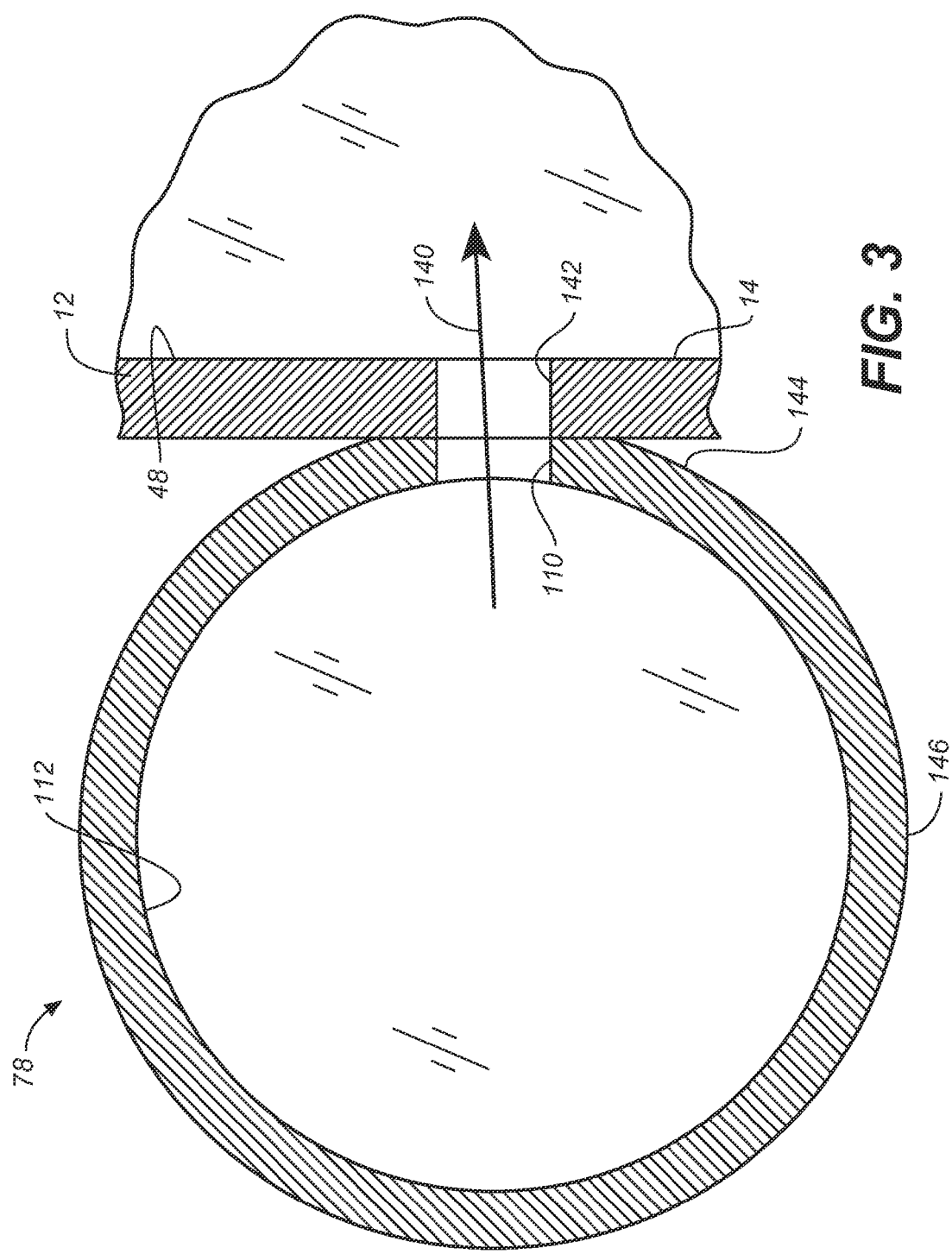
FIG. 3 is a transverse cross sectional view of the gas dispenser of FIG. 2 secured to a fragmentary cross sectional view of the enclosure of the arrangement of FIG. 1.

Now referring to FIG. 2, gas dispenser 78 includes a ring member 146 which defines a hole 144. Ring member 146 also has (i) a lumen 112 defined therein and (ii) a number of exit holes 110 defined on an interior surface 148. Each exit hole 110 is in fluid communication with lumen 112. Gas dispenser 78 is positioned relative to enclosure 12 so that enclosure 12 is located within hole 144 as shown in FIG. 1. Note that gas dispenser 78 is shown in phantom in FIG. 1 for clarity of description. As shown in FIG. 3, gas dispenser 78 is specifically placed relative to enclosure 12 so that each exit hole 110 defined in ring member 146 is aligned with an entrance hole 142 defined in enclosure 12. Note that only one exit hole 110 and one entrance hole 142 is shown in FIG. 3. However, it should be understood that, preferably, there are a plurality of exit holes 110 and entrance holes 142 defined in ring member 146 and enclosure 12, respectively, and that ring member 146 is positioned relative to enclosure 12 such that each exit hole 110 is aligned with an entrance hole 142 as shown in FIG. 3. It should be appreciated that positioning exit holes 110 and entrance holes 142 in the above described manner places lumen 112 in fluid communication with interior void 14 of enclosure 12 such that a fluid, such as a gas, can be advanced from lumen 112 into interior void 14 as indicated by arrow 140 of FIG. 3.

As shown in FIG. 1, it is preferable that gas dispenser 78 be positioned relative to enclosure 12 such that lumen 112 of gas dispenser 78 is in direct fluid communication with second chamber 42 of enclosure 12. In particular, it is preferable that gas dispenser 78 be positioned relative to enclosure 12 such that lumen 112 of gas dispenser 78 is in direct fluid communication with sub-chamber 48 of enclosure 12. Note that the meaning of "direct fluid communication" is the same as discussed above.

Still referring to FIG. 1, etch apparatus 90 is in fluid communication with a pump 100 (e.g. a dry vacuum pump) via a conduit 98. Pump 100 is also connected to a conduit 102 which is in turn connected to gas connector 68. It should be appreciated that the above described arrangement places etch apparatus 90 in fluid communication with gas connector 68. It should also be appreciated that gas connector 68 is preferably placed in direct fluid communication (same meaning as discussed above) with first chamber 40 of enclosure 12 such that pump 10 can advance a fluid, such as a gas, from an etch reactor (not shown) of etch apparatus 90 directly into first chamber 40 of enclosure 12.

Gas source 92 is connected to conduit 104 which is in turn connected to gas port 72 of gas connector 68. In particular, conduit 104 places gas source 92 in fluid communication with passageway 70 of gas connector 68 such that a gas provided by gas source 92 can be advanced into passageway 70 of gas connector 68 via gas port 72. In addition, heating element 94 is placed in thermal communication with the gas provided by gas source 92 so that the gas is heated prior to being advanced into passageway 70 of gas connector 68. For example, heating element 94 may be an electrical heating element placed in contact with conduit 104 so that the electrical heating element heats the gas being advanced from gas source 92 prior to being advanced into passageway 70.

As shown in FIGS. 1 and 2, humidified gas source 96 is connected to a conduit 108 which is in turn connected to gas dispenser 78. In particular, conduit 108 places humidified gas source 96 in fluid communication with lumen 112 such that a humidified gas provided by humidified gas source 96 can be advanced from humidified gas source 96 and into lumen 112 as indicated by arrows 134 and 136 of FIG. 2. What is meant herein by a humidified gas is a gas that has gone through the process of humidification, that is, the process of increasing the water vapor content of the gas. In particular, humidification of a gas as used herein means purposefully adding a quantity of water vapor to the gas such that the water vapor content of the gas is greater than an amount which would normally occur in the gas. For example, the humidified gas can have a humidity of about 50% or more, for example about 70% humidity. One way of humidifying a gas which can be utilized in the present invention is to advance the gas through an aqueous bubbler prior to being advanced into lumen 112 of gas dispenser 78. It should understood that one gas which can be utilized in the present invention for the humidified gas is humidified air.

During the operation of arrangement 10 effluent, such as a gas, generated by an etching process taking place in the etch reactor (not shown) is advanced into passageway 70 of gas connector 68 via conduits 98 and 102. In particular, pump 100 advances the gas from the etch reactor into passageway 70 of gas connector 68. The gas is then directly advanced into first chamber 40 of enclosure 12 in the direction indicated by arrow 114 as shown in FIG. 1. Note that pump 100 advances gas into first chamber 40 at a rate of about 50 sccms (standard cubic centimeters per minute). At the same time pump 100 is advancing gas into passageway 70, a gas is also advanced from gas source 92 into passageway 70 via conduit 104 and gas port 72 at about 20 psi. Furthermore, as previously mentioned, heating element 94 heats the gas being advanced from gas source 92 prior to it entering passageway 70. For example, heating element 94 can heat the gas being advanced into passageway 70 to about 90° C. An example of a gas which can be utilized to advance into passageway 70 is nitrogen.

It should be appreciated that heating the gas from gas source 92 prior to it entering passageway 70 and then mixing the heated gas with the gas from the etch reactor in passageway 70 ensures that chemical components present in the gas from the etch reactor remain in the gaseous state and do not precipitate out in passageway 70. Preventing the aforementioned chemical components from precipitating out in passageway 70 ensures that gas connector 68 remains open so that pump 100 can continue to advance gas or effluent from etch apparatus 90 into enclosure 12. This is contrast to other arrangements which, as previously discussed, suffer from the chemical components precipitating out at inappropriate locations (e.g. prior to reaching the interior of the scrubber) and thus causing the etching process to be stopped.

After exiting passageway 70, the mixture of the gas from etch apparatus 90 and the gas from gas source 92 (herein after referred to as the mixture) enters first chamber 40 of enclosure 12. First chamber 40 has a greater volume than passageway 70 and therefore the mixture tends to cool once located within first chamber 40. As the mixture cools in first chamber 40 the various gaseous components contained within the mixture change from a gaseous form to a solid form as a result of the cooling process. In other words, a gaseous component contained within the mixture precipitates out of the mixture and is trapped as a solid within first chamber 40. For example, when a metal etch process is taking place in the etch reactor one gaseous component produced by this etch process is aluminum chloride. As discussed above, advancing the heated gas into passageway 70 ensures that the aluminum chloride substantially remains in the gaseous state until it is advanced into first chamber 40. Once advanced into first chamber 40, the aluminum chloride cools and precipitates out, for example, on the interior wall of first chamber 40 and on partition 16 thereby being trapped within first chamber 40 and being removed from the gaseous mixture.

The mixture then exits first chamber 40 and enters sub-chamber 44 (and therefor second chamber 42) via orifice 28 as indicated by arrows 116. The mixture further cools in sub-chamber 44 such that, if necessary, additional gaseous components precipitate out in sub-chamber 44 as described above with reference to first chamber 40. For example, additional aluminum chloride can precipitate out, and be trapped in, sub-chamber 44.

The mixture then exits sub-chamber 44 and enters sub-chamber 46 via orifice 30 as indicated by arrows 118. The mixture cools further in sub-chamber 46 such that additional gaseous components can precipitate out in sub-chamber 46 as described above with reference to first chamber 40. For example, additional aluminum chloride can also precipitate out, and be trapped in, sub-chamber 46.

The mixture then exits sub-chamber 46 and enters sub-chamber 48 via orifice 32 as indicated by arrows 120. The mixture continues to cool but is also exposed to, and mixed with, the humidified gas. In particular, as discussed above in reference to FIG. 2, humidified gas is advanced form humidified gas source 96 into lumen 112 in the directions indicated by arrows 134 and 136. The humidified gas is also advanced through exit holes 110 in the direction indicated by arrows 138. After advancing through exit holes 110, the humidified gas is advanced through entrance holes 142 in the direction indicated by arrow 140 (see FIG. 3) where it enters sub-chamber 48 and combines with the mixture.

Combining the humidified gas with the mixture causes additional gaseous components of the mixture to precipitate in sub-chamber 48. In particular, gaseous components present in the mixture which react with water will react with the water vapor present in the humidified gas and can thus form a precipitate which is trapped in sub-chamber 48. For example, when a metal etch process is taking place in the etch reactor another gaseous component produced by this etch process is boron oxide. Boron oxide reacts with the water vapor present in sub-chamber 48 so as to form boric acid which precipitates in sub-chamber 48 such that the boric acid is trapped in sub-chamber 48 thereby removing boron oxide from the mixture.

The mixture then exits sub-chamber 48 and enters sub-chamber 50 via orifice 34 as indicated by arrows 122. The mixture then exits sub-chamber 50 and enters sub-chamber 52 via orifice 36 as indicated by arrows 124. The mixture then exits sub-chamber 52 and enters sub-chamber 54 via orifice 38 as indicated by arrow 126. The mixture further cools and/or further reacts with the water vapor in sub-chambers 50, 52, and 54 such that additional gaseous components, e.g. aluminum chloride and/or boron oxide, are removed, i.e. precipitated from the mixture. It should be understood that having each orifice 28, 30, 32, 34, 36, and 38 offset from each adjacent orifice in the previously described manner helps to slow the advancement of the etch effluent through interior void 14 of enclosure 12 and thus enhances the efficiency at which gaseous components of the mixture are precipitated out.

The gaseous components remaining in the mixture then exit sub-chamber 54 via exit port 80 and are advanced through pipe 130 in the direction indicated by arrow 128. The mixture can then be subjected to further processing or vented depending upon the particular characteristics of the etch process being utilized.

In light of the above discussion, it should be appreciated that the present invention functions to abate the effluent generated by an etch process while substantially preventing the gaseous components thereof from precipitating out in inappropriate locations, e.g. in the duct work or conduits of the exhaust system. In particular, the present invention ensures that the gaseous components of the etch effluent precipitate out in an appropriate location, i.e. within interior void 14 of enclosure 12. By controlling where the gaseous components of the etch effluent precipitate in the above described manner, the present invention ensures that etch effluent continues to reach enclosure 12 and is not obstructed from entering interior void 14. Therefore, the etch process can continue without any of the above discussed interruptions thereby enhancing the efficiency of semiconductor wafer fabrication.

A number of etching process can take place before enclosure 12 needs to be cleaned or replaced. When enclosure 12 needs to be cleaned or replaced can be ascertained by visually inspecting interior void 14 via inspection ports 132. Once it is determined that enclosure 12 does require service it can be cleaned with water or simply replaced. To replace enclosure 12, enclosure 12 is removed from etch apparatus 90 so that enclosure 12 is no longer in fluid communication with etch apparatus 90 (note that no etching process should be taking place when enclosure 12 is removed from the etch apparatus 90). Enclosure 12 is also removed from gas source 92 and humidified gas source 96. A replacement enclosure (not shown) which is substantially identical to enclosure 12 and contains all the same components and has all the same advantages as discussed above is then placed in fluid communication with etch apparatus 90, gas source 92, and humidified gas source 96 in a substantially identical manner as described above. Etching with etch apparatus 90 can then continue in the above described manner with the replacement apparatus abating the effluent from the etch process in a substantially identical manner as described above in reference to FIGS. 1-3.

It should be appreciated that, preferably, enclosure 12 and partitions 16, 18, 20, 22, 24, and 26 are all fabricated from fiberglass and thus are relatively inexpensive. Therefore, it is commercially feasible to simply discard enclosure 12 and replace it with a new one which is quicker than attempting to clean the used enclosure. This is in contrast with other scrubber type devices which are typically fabricated from stainless steel which can be expensive and thus less likely to be discarded and therefore must be cleaned.

In addition, it should be appreciated that fiberglass as compared to stainless steel is relatively resistant to the chemicals which are produced by the etch processes. Therefore, the present invention does not suffer from the corrosion problems associated with using scrubbing devices fabricated from stainless steel.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

What is claimed is:

1. A process effluent abatement arrangement, comprising:
an enclosure which defines an interior void;
a first partition having a first orifice defined therein, said first partition being positioned within said interior void such that (i) said first partition divides said interior void into a first chamber and a second chamber and (ii) said first orifice is in fluid communication with said first chamber and said second chamber;
a gas connector which has (i) a passageway defined therethrough and (ii) a gas port in fluid communication with said passageway, said passageway (A) having an inlet and an outlet and (B) being in direct fluid communication with said first chamber of said enclosure, said gas port being downstream of said inlet and upstream of said outlet;
a gas dispenser in direct fluid communication with said second chamber of said enclosure; and
an exit port in fluid communication with said interior void.

2. The arrangement of claim 1, further comprising:
a second partition having a second orifice defined therein, wherein (i) said second partition is positioned within said second chamber, (ii) said first orifice has a first central axis, (iii) said second orifice has a second central axis, and (iv) said second central axis of said second orifice is offset relative to said first central axis of said first orifice.

3. The arrangement of claim 2, further comprising:
a third partition having a third orifice defined therein;
a fourth partition having a fourth orifice defined therein;
a fifth partition having a fifth orifice defined therein; and
a sixth partition having a sixth orifice defined therein,
wherein said second partition, said third partition, said fourth partition, said fifth partition, and said sixth partition are all positioned within said second chamber such that said second chamber is divided into a first sub-chamber, a second sub-chamber, a third sub-chamber, a fourth sub-chamber, a fifth sub-chamber, and a sixth sub-chamber.

4. The arrangement of claim 3, wherein:
each of said first partition, said second partition, said third partition, said fourth partition, said fifth partition, and said sixth partition are spaced apart along a longitudinal axis of said enclosure so that said longitudinal axis passes through a center point $P_1$ of said first partition, a center point $P_2$ of said second partition, a center point $P_3$ of said third partition, a center point $P_4$ of said fourth partition, a center point $P_5$ of said fifth partition, and a center point $P_6$ of said sixth partition, and
said second partition is positioned adjacent to said first partition such that (i) said first sub-chamber is interposed said first partition and said second partition and (ii) said first orifice is in direct fluid communication with said first chamber and said first sub-chamber,
said third partition is positioned adjacent to said second partition such that (i) said second sub-chamber is interposed said second partition and said third partition and (ii) said second orifice is in direct fluid communication with said first sub-chamber and said second sub-chamber,
said fourth partition is positioned adjacent to said third partition such that (i) said third sub-chamber is interposed said third partition and said fourth partition and (ii) said third orifice is in direct fluid communication with said second sub-chamber and said third sub-chamber,
said fifth partition is positioned adjacent to said fourth partition such that (i) said fourth sub-chamber is interposed said fourth partition and said fifth partition and (ii) said fourth orifice is in direct fluid communication with said third sub-chamber and said fourth sub-chamber,
said sixth partition is positioned adjacent to said fifth partition such that (i) said fifth sub-chamber is interposed said fifth partition and said sixth partition and (ii) said fifth orifice is in direct fluid communication with said fourth sub-chamber and said fifth sub-chamber, and
an end wall of said enclosure is positioned adjacent to said sixth partition such that (i) said sixth sub-chamber is interposed said end wall and said sixth partition and (ii) said sixth orifice is in direct fluid communication with said fifth sub-chamber and said sixth sub-chamber.

5. The arrangement of claim 4, wherein:
said third orifice has a third central axis and said third central axis of said third orifice is offset relative to said second central axis of said second orifice,
said fourth orifice has a fourth central axis and said fourth central axis of said fourth orifice is offset relative to said third central axis of said third orifice,
said fifth orifice has a fifth central axis and said fifth central axis of said fifth orifice is offset relative to said fourth central axis of said fourth orifice, and
said sixth orifice has a sixth central axis and said sixth central axis of said sixth orifice is offset relative to said fifth central axis of said fifth orifice.

6. The arrangement of claim 5, wherein:
said longitudinal axis divides said enclosure into a first half and a second half,
said first central axis of said first orifice is aligned with said longitudinal axis,
said second orifice of said second partition, said fourth orifice of said fourth partition, and said sixth orifice of said sixth partition are located within said first half of said enclosure, and
said third orifice of said third partition and said fifth orifice of said fifth partition are located within said second half of said enclosure.

7. The arrangement of claim 1, further comprising:
an etch apparatus which generates an etch gas product, said etch apparatus being in fluid communication with said gas connector such that said etch gas product generated by said etch apparatus is advanced into said interior void of said enclosure.

8. The apparatus of claim 1, further comprising:
a gas source containing a gas, said gas source being in fluid communication with said gas port of said gas connector such that said gas contained by said gas source is advanced into said passageway of said gas connector.

9. The apparatus of claim 8, further comprising:
an electrical heating element which is in thermal communication with said gas provided by said gas source so that said gas is heated prior to being advanced into said passageway of said gas connector.

10. The apparatus of claim 1, further comprising:
a humidified gas source for providing a humidified gas, said humidified gas source being in fluid communication with said gas dispenser such that said humidified gas is advanced into said gas dispenser and into said second chamber of said enclosure.

11. An arrangement for abating effluent, comprising:
an enclosure which defines an interior void;
a gas connector which has (i) a passageway defined therethrough and (ii) a gas port in fluid communication with said passageway, said passageway (A) having an inlet and an outlet and (B) being in fluid communication with said interior void of said enclosure;

a gas dispenser in fluid communication with said interior void of said enclosure;

an exit port in fluid communication with said interior void of said enclosure; and an etch apparatus which generates an etch gas product, said tech apparatus being in fluid communication with said gas connector such that said etch gas product generated by said etch apparatus is advanced into said interior void of said enclosure.

12. The arrangement of claim 11, further comprising:

a gas source containing a gas, said gas source being in fluid communication with said gas port of said gas connector such that said gas contained by said gas source is advanced into said passageway of said gas connector; and a heating element which is in thermal communication with said gas provided by said gas source so that said gas is heated prior to being advanced into said passageway of said gas connector.

13. The arrangement of claim 12, further comprising:

a humidified gas source for providing a humidified gas, said humidified gas source being in fluid communication with said gas dispenser such that said humidified gas is advanced into said gas dispenser and into said interior void of said enclosure.

14. The arrangement of claim 13, further comprising:

a first partition having a first orifice defined therein, said first partition being positioned within said interior void of said enclosure such that (i) said first partition divides said interior void into a first chamber and a second chamber and (ii) said first orifice is in fluid communication with said first chamber of said second chamber; and a second partition having a second orifice defined therein, wherein (i) said gas connector is in fluid communication with said interior void such that said etch gas product generated by said etch apparatus is advanced directly into said first chamber of said interior void, (ii) said second partition is positioned within said second chamber of said interior void, (iii) said gas dispenser is in fluid communication with said interior void such that said humidified gas is advanced directly into said second chamber of said interior void, (iv) said first orifice has a first central axis, (v) said second orifice has a second central axis, and (vi) said second central axis of said second orifice is offset relative to said first central axis of said first orifice.

15. The arrangement of claim 2, wherein said first orifice comprises a largest orifice in said first partition, and said second orifice comprises a largest orifice in said second partition.

16. A process effluent abatement arrangement, comprising:

an enclosure which defines an interior void and a longitudinal axis;

a first partition having a first orifice defined therein, said first partition being positioned within said interior void such that (i) said first partition divides said interior void into a first chamber and a second chamber and (ii) said first orifice is in fluid communication with said first chamber and said second chamber;

a second partition having a second orifice defined therein, wherein (i) said second partition is positioned within said second chamber, (ii) said first orifice has a first central axis that is substantially aligned with the longitudinal axis of the enclosure, said first central axis being unobstructed such that gas can pass from the first chamber to the second chamber through the first central axis, (iii) said second orifice has a second central axis, and (iv) said second central axis of said second orifice is offset relative to said first central axis of said first orifice;

a gas connector which has (i) a passageway defined therethrough and (ii) a gas port in fluid communication with said passageway, said passageway (A) having an inlet and an outlet and (B) being in direct fluid communication with said first chamber of said enclosure;

a gas dispenser in direct fluid communication with said second chamber of said enclosure; and an exit port in fluid communication with said interior void.

17. The arrangement of claim 16, wherein the gas port is disposed between the inlet and the outlet of the passageway.

18. The arrangement of claim 16, further comprising:

a humidified gas source for providing a humidified gas, said humidified gas source being in fluid communication with said gas dispenser such that said humidified gas is advanced into said gas dispenser and into said second chamber of said enclosure.

* * * * *